(12) United States Patent
Lo et al.

(10) Patent No.: US 6,321,976 B1
(45) Date of Patent: Nov. 27, 2001

(54) METHOD OF WIRE BONDING FOR SMALL CLEARANCE

(75) Inventors: Randy H. Y. Lo, Taipei; Han-Ping Pu; Tony Yuan, both of Tai-Chung, all of (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 0 days.

(21) Appl. No.: 09/577,686

(22) Filed: May 22, 2000

(51) Int. Cl.[7] .......................... B23K 37/00; B23K 31/00; H01L 23/495
(52) U.S. Cl. .................... 228/180.5; 228/4.5; 29/841; 29/843; 257/666
(58) Field of Search .................... 228/180.5, 4.5; 29/843, 841; 219/56.21, 56.22; 257/666

(56) References Cited

U.S. PATENT DOCUMENTS

| | | | |
|---|---|---|---|
| 4,907,734 | * | 3/1990 | Conru et al. ........................ 228/123 |
| 5,086,335 | * | 2/1992 | Leibovitz et al. .................... 357/70 |
| 5,090,119 | * | 2/1992 | Tsuda et al. ........................ 29/843 |
| 5,205,463 | * | 4/1993 | Holdgrafer et al. ................ 228/102 |
| 5,311,404 | * | 5/1994 | Trask et al. ........................ 361/762 |
| 5,495,398 | * | 2/1996 | Takiar et al. ....................... 361/790 |
| 5,558,270 | * | 9/1996 | Nachon et al. .................... 228/180.5 |
| 5,677,567 | * | 10/1997 | Ma et al. ............................ 257/666 |
| 5,842,628 | * | 12/1998 | Nomoto et al. ................... 228/180.5 |
| 5,938,952 | * | 8/1999 | Lin et al. ........................ 219/121.64 |
| 6,001,724 | * | 12/1999 | Stansbury ........................... 438/617 |
| 6,060,769 | * | 5/2000 | Wark ................................. 257/666 |
| 6,075,281 | * | 3/1999 | Liao et al. .......................... 257/666 |
| 6,079,610 | * | 6/2000 | Maeda et al. .................... 228/180.5 |
| 6,080,264 | * | 6/2000 | Ball ................................... 156/292 |
| 6,097,087 | * | 8/2000 | Farnworth et al. ................ 257/698 |
| 6,121,070 | * | 11/1998 | Akram .............................. 438/108 |

\* cited by examiner

Primary Examiner—Tom Dunn
Assistant Examiner—L. Edmondson

(57) ABSTRACT

A method of wire bonding for small clearance employs a conductive bump over the pad of a chip to prevent a capillary from colliding with the chip during three-dimensional package wiring process. The conventional constraint which limits the clearance to greater than 0.2 mm so as to find an appropriate capillary is overcome in this method.

8 Claims, 2 Drawing Sheets

METHOD OF WIRE BONDING FOR SMALL CLEARANCE

FIELD OF THE INVENTION

The present invention relates to a method of wire bonding for small clearance, and more specifically, to a method of employing a conductive bump over the pad of a chip to prevent a capillary from colliding with the chip during three-dimensional package wiring process.

BACKGROUND OF THE INVENTION

At present, the commercialized electronic products have a trend of being lightweight, thin, short and small size. Therefore, very large scale integrated circuits (VLSI) have been widely used. As the development of semiconductors advances, the total number of transistors in a die greatly increases, and at the same time, the requirement in the density of a package becomes more and more strict. A three dimensional package is thus developed to greatly increase the package density in order to overcome the issue.

However, during packaging, the pad of a chip is soldered to a lead frame by wiring, and when the chips are adhered in a three dimensional manner, a capillary may collide with some higher chips to damage the chips and the capillary because the size of each chip is similar.

In the prior art, the steps of wiring comprises: (1) the capillary solders the wire on a pad by a thermal process or super sonic technique; (2) the capillary rises to form a vertical wire; (3) the capillary translates the wire to the lead frame; and (4) another end of the wire is soldered onto the lead frame.

For the process which needs a long wire, a reverse loop D has to be added to the stroke of the capillary to enhance the strength of the wire.

This step is feasible in single chip package wiring. However, in the three dimensional package wiring, the effect of the reverse loop D has to be taken into consideration, as shown in FIG. 1. The sizes of the upper and lower chips 11 and 12 are almost the same in the package application. Therefore, when the two chips 11 and 12 are assembled together by soldering process, the capillary 14 may collide with the chip 11 to damage the capillary 14 and the chip 11 resulting in failure of wiring if the distance A from the pad 13 in the chip 12 to the rim of the chip 11 is very small and one of the reverse loop D, the radius C of the capillary, and the thickness E of the chip 11 is too big, or the distance A from the center of the pad in the chip 12 to the rim of the chip 11 is too small. The solution of the prior art is to select a smaller capillary 14. However, there is a disadvantage that the appropriate capillary can not be found if the distance A between the pad 13 in the chip 12 and the rim of the chip 11 is smaller than 0.2 mm.

SUMMARY OF THE INVENTION

An object of the present invention is to provide a method of wire bonding for small clearance, which overcomes the disadvantage in the prior arts that the distance A between the center of the pad in the chip 12 and the rim of the chip 11 is too small to perform the wiring process by the conventional wiring equipment. The method of the present invention can prevent the capillary from colliding with the chip during the three-dimensional package wiring process. In the present invention, a conductive bump 15 is first formed over the pad 13 of the chip 12 and then the chip is connected to the lead frame by the conventional wiring method. The height H of the bump 15 is determined by the reverse loop D, the radius C of the capillary 14, the thickness E of the chip 11, and the distance A between the pad 13 in the chip 12 and the rim of the chip 11.

Other features and advantages of the invention will become apparent from the following description of the invention that refers to the accompanying drawings.

DETAILED DESCRIPTION OF THE PREFERRED EMBODIMENT

Figure 1:
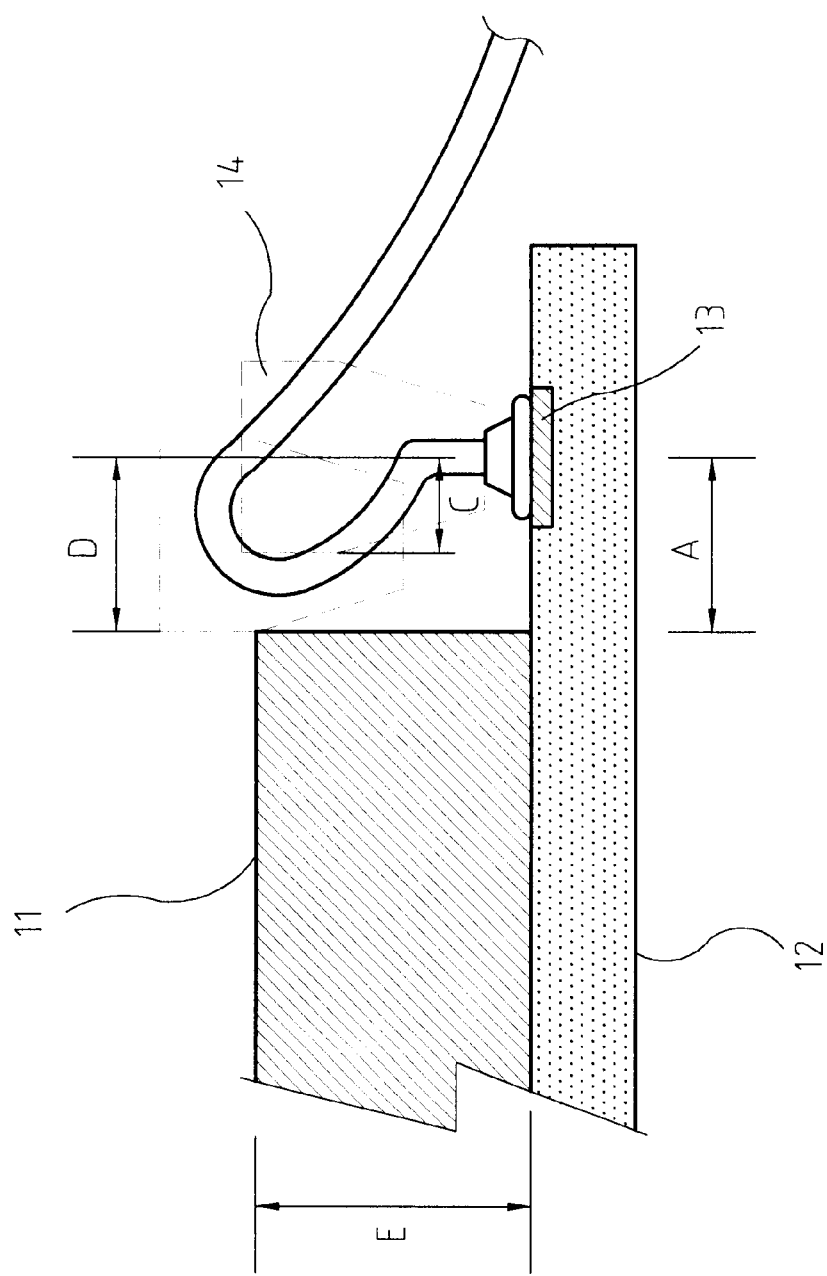
FIG. 1 is a schematic diagram illustrating the stub structure by a conventional chip wiring method.
Figure 2:
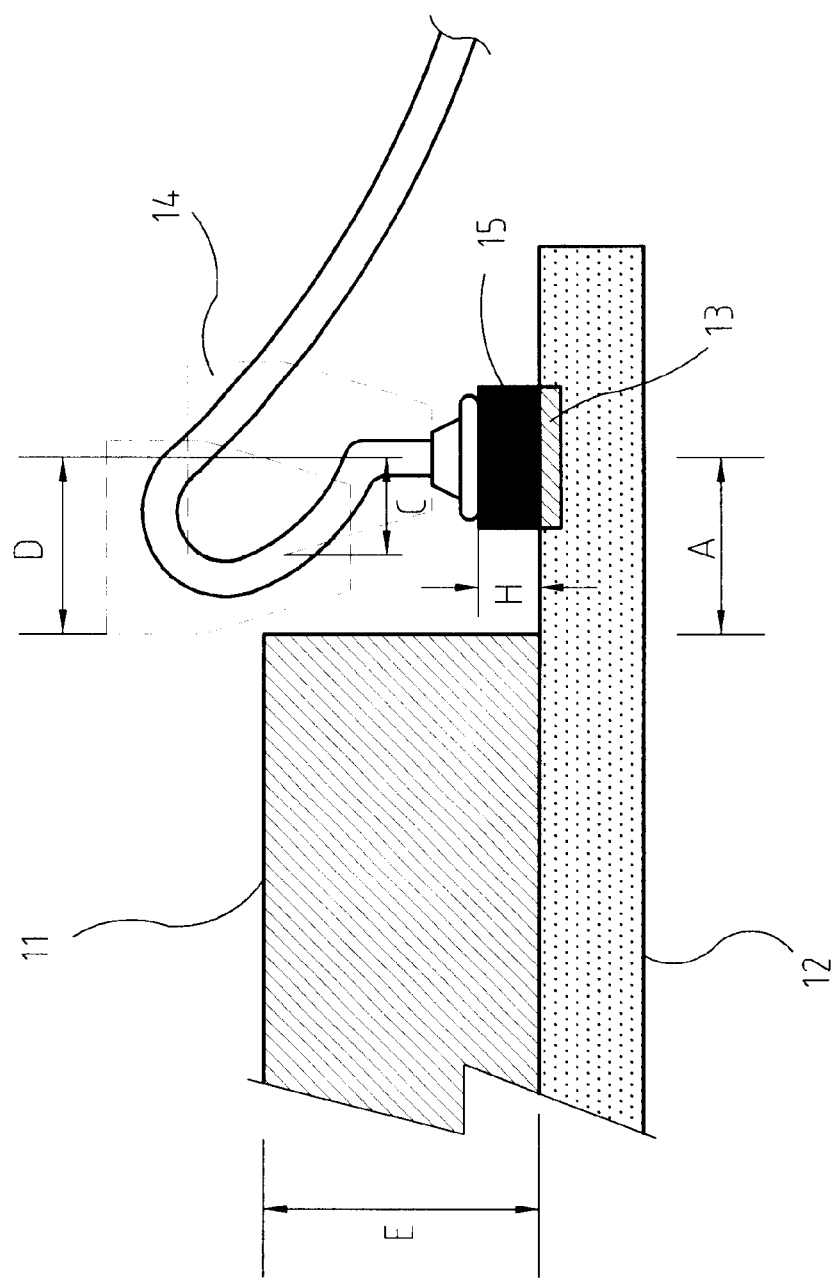
FIG. 2 is a schematic diagram illustrating the stub structure by a new chip wiring method according to the present invention.

When the distance A is too small, as shown in FIG. 1, it is possible to overcome the issue that the capillary 14 may collide with the chip 11 by increasing the space for the reverse loop D of the capillary 14. With reference to FIG. 2, the stub structure used in the wiring method for small clearance according to the present invention comprises a body, which at least consists of the chips 11 and 12. The present invention is characterized as that the pad 13 is covered by a conductive bump 15, which is made of one conductive material selected from metal, alloy, polymer and the mixture. Gold, aluminum, and copper are examples of the metal. Apparently, the present invention increases the space for the reverse loop D of the capillary 14 with respect to the prior art shown in FIG. 1 The constraint to limit the clearance (distance A) between the chips is allowed a wider range so as to overcome the failure of wiring in a three dimensional package with small clearance.

In the steps of the method of the present invention, the pad 13 of the chip 12 is first covered with the conductive bump 15, and then the chip is connected to the lead frame by the conventional wiring process. The height H of the bump 15 is determined by the reverse loop D, the radius C of the capillary 14, the thickness E of the chip 11, and the distance A between the pad 13 in the chip 12 and the rim of the chip 11. The present invention provides the stability of the prior art and meets the requirement of the present and future process.

The present invention employs the above technique with a conductive bump to overcome the present problem in the new process so that the issue that the capillary may collide with the chip is solved in a three dimensional package with small clearance. The conductive bump can be formed by evaporation, sputtering, etching, plating, printing, or stud bonding.

The present invention provides the following advantages:
(1) the issue that the capillary may collide with the chip is solved in a three dimensional package with small clearance;
(2) the clearance between the chip and the pad is allowed smaller than 0.2 mm in the three dimensional package;
(3) the present equipment can be used to implement the method of the present invention so as to save the cost; and
(4) only one step is added in the manufacturing process to keep the stability of the prior art.

Although only the preferred embodiments of this invention were shown and described in the above description, it is requested that any modification or combination that comes within the spirit of this invention be protected.

What is claimed is:

1. A method of wire bonding of a connection pad on a chip edge area between two chips of a three dimensional chip package, comprising the steps of:
   preparing a first chip having at least a connection pad near an edge of said first chip;
   stacking and positioning a second chip above said first chip, said second chip having an edge located near said connection pad;
   forming a substantially flat conductive bump with an appropriate thickness on said connection pad, said edge of said second chip and the center location of said conductive bump having a distance which is approximately the size of the radius of a capillary;
   soldering one end of a wire to said conductive bump using said capillary; and
   bending said wire near said end to form a reverse loop above said conductive bump;
   wherein said appropriate thickness of said conductive bump is sufficiently large for avoiding collision between said capillary and said second chip when said wire is soldered to said conductive bump and when said wire is bent to form said reverse loop.

2. The method as claimed in claim 1, said conductive bump comprising a material selected from the group of a metal, an alloy, and a polymer, or a mixture of materials selected from said group.

3. The method as claimed in claim 1, said conductive bump comprising a metal selected from the group of gold, aluminum, and copper.

4. The method as claimed in claim 1 said conductive bump being formed by evaporation, sputtering, etching, plating, printing, or stud bonding.

5. A wire bonding structure of a connection pad on a chip edge area between two chips of a three dimensional chip package, comprising:
   a first chip having at least a connection pad near an edge of said first chip;
   a second chip stacked and positioned above said first chip, said second chip having an edge located near said connection pad;
   a substantially flat conductive bump with an appropriate thickness formed on said connection pad, said edge of said second chip and the center location of said conductive bump having a distance which is approximately the size of the radius of a capillary; and
   a wire having one end soldered to said conductive bump and a reverse loop near said end formed above said conductive bump using said capillary;
   wherein said appropriate thickness of said conductive bump is sufficiently large for avoiding collision between said capillary and said second chip when said wire is soldered to said conductive bump and when said wire is bent to form said reverse loop by using said capillary.

6. The wire bonding structure as claimed in claim 5, said conductive bump comprising a material selected from the group of a metal, an alloy, and a polymer, or a mixture of materials selected from said group.

7. The wire bonding structure as claimed in claim 5, said conductive bump comprising a metal selected from the group of gold, aluminum, and copper.

8. The wire bonding structure as claimed in claim 5, said conductive bump being formed by evaporation, sputtering, etching, plating, printing, or stud bonding.

* * * * *